(12) United States Patent
Nishikawa et al.

(10) Patent No.: US 6,244,211 B1
(45) Date of Patent: Jun. 12, 2001

(54) PLASMA PROCESSING APPARATUS

(75) Inventors: Kazuyasu Nishikawa; Tatsuo Oomori; Hiroki Ootera, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/437,732

(22) Filed: Nov. 10, 1999

(30) Foreign Application Priority Data

May 19, 1999 (JP) .................................................. 11-138375

(51) Int. Cl.$^7$ .................................................. C23C 16/00
(52) U.S. Cl. ..................................... 118/723 AN; 156/345
(58) Field of Search ........................ 118/723 I, 723 IR, 118/723 AN, 723 E, 723 ER; 156/345

(56) References Cited

U.S. PATENT DOCUMENTS

| | | | |
|---|---|---|---|
| 4,371,412 | * | 2/1983 | Nishizawa ............................ 156/345 |
| 5,022,979 | * | 6/1991 | Hijikata et al. ................. 204/298.33 |
| 5,716,451 | * | 2/1998 | Hama et al. ........................... 118/723 |
| 5,785,878 | * | 7/1998 | Lingampalli ............................ 216/68 |
| 5,800,621 | * | 9/1998 | Redeker et al. ............... 118/723 AN |
| 5,804,027 | * | 9/1998 | Uchida ................................... 156/345 |
| 5,936,352 | * | 8/1999 | Samukawa et al. ............ 315/111.51 |
| 6,024,827 | * | 2/2000 | Ishii ...................................... 156/345 |
| 6,027,601 | * | 2/2000 | Hanawa ................................ 156/345 |
| 6,028,286 | * | 2/2000 | Wicker et al. .................. 219/121.53 |
| 6,054,013 | * | 4/2000 | Collins et al. ......................... 156/345 |

FOREIGN PATENT DOCUMENTS

| | | |
|---|---|---|
| 8-081777 | 3/1996 | (JP) . |
| 8-227800 | 9/1996 | (JP) . |
| 9-074089 | 3/1997 | (JP) . |

* cited by examiner

Primary Examiner—Gregory Mills
Assistant Examiner—Luz Alejandro
(74) Attorney, Agent, or Firm—McDermott, Will & Emery (57) ABSTRACT

A plasma processing apparatus has a processing chamber in which are provided one or more radio frequency antennas and a grounded opposite electrode positioned opposite to a sample. The radio frequency antenna 7 is formed of a material having no more than $\frac{1}{100}$ the volume resistivity of a material forming the opposite electrode. The radio frequency antenna may be buried in the opposite electrode, with its surface partially exposed to the plasma. Thus, the apparatus can have an enhanced processing rate and also provide a uniform process.

11 Claims, 7 Drawing Sheets

PLASMA PROCESSING APPARATUS

BACKGROUND OF THE INVENTION

1. Field of the Invention

The present invention relates to a plasma processing apparatus employing a plasma to form a thin film on a surface of a sample, etching a surface of a sample, and the like.

2. Description of the Background Art

A conventional radio frequency (RF) plasma processing apparatus with parallel plates has been widely used as an apparatus using a plasma to process a sample, such as a substrate, a semiconductor wafer (simply referred to as a "wafer" hereinafter), in a processing chamber thereof. In this plasma processing apparatus, an RF power is applied to one or both of electrodes to generate a plasma between the electrodes and a self-bias voltage between the plasma and a sample allows ions to be introduced into a surface of the sample. This plasma processing apparatus is configured to form a thin film through plasma CVD, provide etching process, and the like.

For the above-mentioned parallel plate RF plasma processing apparatus, however, it is difficult to achieve required fine pattern formation and damage reduction associated with high integration and performance of semiconductor devices. In other words, in order to implement such processes, it is important to generate and control a low-pressure high-density plasma. Furthermore, the plasma should be uniform over a large area to process a wafer of a large diameter.

To satisfy such demands, various plasma sources have been proposed and applied to semiconductor processes. In particular, an inductively coupled plasma apparatus employing an RF antenna 7, as shown in FIG. 11, may be applied to semiconductor processes since the apparatus can relatively simply be constructed and is also capable of generating a low-pressure high-density plasma.

Figure 11:
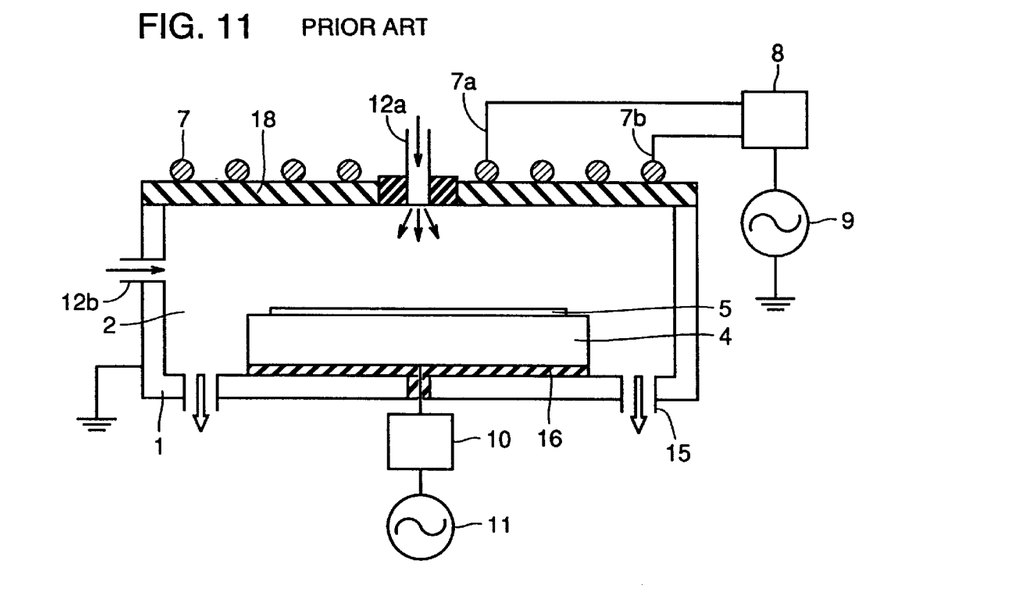
FIG. 11 is a conceptual view of a plasma processing apparatus according to a conventional technology.

In the apparatus, as shown in FIG. 11, that side of a processing chamber which is opposite to a sample mounting stage 4 is constructed of a dielectric window 18 made, e.g., of quartz glass. Dielectric window 18 has an external surface having mounted thereto RF antenna 7 comprised of a planar, spiral coil. An RF electric field is radiated in processing chamber 2 through RF antenna 7. By allowing electrons present in the electromagnetic field to collide with neutral particles of processing gases, the processing gases disocate ions and neutrals, resulting generation of a plasma. Ions in the plasma are accelerated toward a sample by an RF bias voltage independently applied to sample mounting stage 4 and the ions are thus introduced into a sample to form a thin film, provide an etching process, and the like.

For the above-mentioned inductively coupled plasma processing apparatus used to form a thin film, provide etching process, and the like, dielectric window 18 of quartz glass or the like existing between RF antenna 7 and a generated plasma degrades the transmission efficiency of an RF power to the plasma. Accordingly, the power applied to RF antenna 7 should be increased to obtain a low-pressure high-density plasma.

Furthermore, the phenomenon that plasma density rapidly increases at more than an RF power (i.e., a mode jump phenomenon) is frequently observed and processing conditions can thus be disadvantageously limited.

Furthermore, the ionized species, reaction products and the like of the processing gases can be deposited on an internal surface of dielectric window 18 and ions can sputter dielectric window 18 and thus vary its thickness, so that L and C matching circuits formed via dielectric window 18 can change to disadvantageously vary a discharge condition. In particular, a conductive film deposited on dielectric window 18 can cause short-circuit of an RF electric field.

Furthermore, dust particles can be produced from a film deposited on dielectric window 18 by ion sputtering on, dielectric window 18, or the like.

Furthermore, if a grounded electrode (not shown) for an RF bias voltage applied to a sample is provided around mounting stage 4, the bias is not uniformly applied to the sample, often disadvantageously resulting in uneven processing rate. In particular, in the case that the grounded electrode is far from a sample, an arc discharge can be occurred between the stage and other grounded metallic parts of the apparatus.

SUMMARY OF THE INVENTION

The present invention has been made to solve the above disadvantages.

An object of the present invention is to generate a low-pressure high-density plasma to achieve a high processing rate.

Another object of the present invention is to apply an RF bias voltage uniformly to a sample to achieve a more uniform process.

To achieve the above objects, a plasma processing apparatus in one aspect of the present invention is a plasma processing apparatus for processing a sample in a processing chamber including therein one or more RF antennas and a grounded electrode located opposite to the sample so that when the RF antenna receives an RF power an inductively coupled plasma is excited in the processing chamber to provide the above process.

The above configuration with an RF antenna provided in a processing chamber can enhance the transmission efficiency of an RF power to a plasma and consequently can generate a low-pressure high-density plasma with low power to achieve high processing rate in the apparatus. Furthermore, a grounded electrode located opposite to a sample allows an RF bias voltage to be uniformly applied to the sample to uniformly process the sample. Furthermore, since one or more RF antennas may be used, a plurality of RF antennas may be used to vary the plasma density distribution in the processing chamber.

In the present invention, preferably the plasma processing apparatus has a device applying an RF bias voltage or a direct current voltage to the electrode located opposite to a sample (opposite electrode).

With the above configuration, a self-bias voltage can be produced at the opposite electrode and the opposite electrode can be sputtered to allow the control of the composition ratio between ions and neutral particles in a plasma, depending on appropriate material selection for the opposite electrode.

In the present invention still preferably the plasma processing apparatus has the RF antenna and the opposite electrode that are spaced.

The configuration with the opposite electrode and the RF antenna spaced can prevent short-circuit between the RF antenna and the opposite electrode if a conductive foreign matter or conductive film deposits on or adsorbs on the RF antenna.

In another aspect of the present invention, the plasma processing apparatus has the RF antenna made of a material having no more than ¹⁄₁₀₀ the volume resistivity of the opposite electrode.

With the above configuration, if the RF antenna is in contact with the opposite electrode most of RF current can flow in the RF antenna rather than the opposite electrode and the RF antenna can thus generate a low-pressure high-density plasma.

In the present invention still preferably the RF antenna and the opposite electrode are in contact with each other.

The above configuration can reduce a distance between the opposite electrode and a sample. This ensures that an RF bias voltage are more uniformly applied to the sample and that the aspect ratio of processing apparatus is also reduced in size.

In another aspect of the present invention, the plasma processing apparatus has the RF antenna buried in the opposite electrode such that the RF antenna is partially exposed to the plasma.

The above configuration can reduce dust particles, preventing reaction products and the like from depositing on a corner otherwise formed by the opposite electrode and the RF antenna or a gap otherwise created between the opposite electrode and the RF antenna that is attributed to poor working precision, thermal distortion and the like.

In the present invention still preferably the plasma processing apparatus includes a dielectric film covering a portion of the RF antenna that contacts the opposite electrode.

With the above configuration, the RF antenna can be electrically isolated from the opposite electrode to eliminate the possibility of RF current flowing to the opposite electrode. Accordingly, a material which the opposite electrode in composed of and that which the RF antenna is composed of may have a same volume resistivity or they may have their respective resistivities with a slight difference therebetween.

In the present invention still preferably the plasma processing apparatus is comprised of the opposite electrode covered with a dielectric film.

The above configuration eliminates the possibility of RF current flowing to the opposite electrode. Thus a high-density plasma can be created if a material deposited on the opposite electrode and that deposited on the RF antenna have same volume resistivity or their respective volume resistivities with a slight difference therebetween.

In the present invention still preferably the plasma processing apparatus is comprised of the RF antenna covered with a dielectric film.

The above configuration allows any material to be used for the RF antenna and can also prevent metal contamination attributed to the material of the RF antenna. Furthermore, the above configuration can reduce current leakage to the opposite electrode when the RF antenna is in contact with the opposite electrode.

In the present invention still preferably the plasma processing apparatus has the RF antenna made of at least one material selected from the group consisting of carbon, aluminum, copper, stainless steel, tungsten and titanium.

With the above configuration, the RF antenna can be made of a material not to react easily to processing gas and plasma.

In the present invention still preferably the plasma processing apparatus has the opposite electrode made of at least one material selected from the group consisting of silicon, carbon, and silicon carbide.

The above configuration, using silicon or carbon as a material for the opposite electrode, allows control of the composition ratio between ions and neutral particles in a plasma.

In the present invention still preferably the plasma processing apparatus includes a circuit for applying an RF power to each RF antenna, and a switch circuit capable of changing the RF applying circuit in configuration, wherein each RF antenna can be substantially changed in configuration when the switch circuit changes over.

With the above configuration, RF antennas can be changed in position, length and number, as required, to select a plasma density distribution suitable for a process.

In the present invention still preferably the plasma processing apparatus has a device applying an RF power to the RF antenna and an RF power to the opposite electrode, with a difference between the frequencies of the RF powers.

With the above configuration, specific neutral particles and ions can be consumed at the opposite electrode or the surface atoms of the opposite electrode can be sputtered into a plasma to vary the composition ratio between the neutral particles and ions in the plasma, depending on the material used for the opposite electrode and the processing gas used.

A semiconductor device according to the present invention is that manufactured using the plasma processing apparatus described above.

Thus there can be provided a semiconductor device plasma-processed uniformly over the entire surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Reference will now be made to FIGS. 1–10 to describe plasma processing apparatuses according to the embodiments of the present invention.

First Embodiment

Apparatus Configuration

Figure 1:
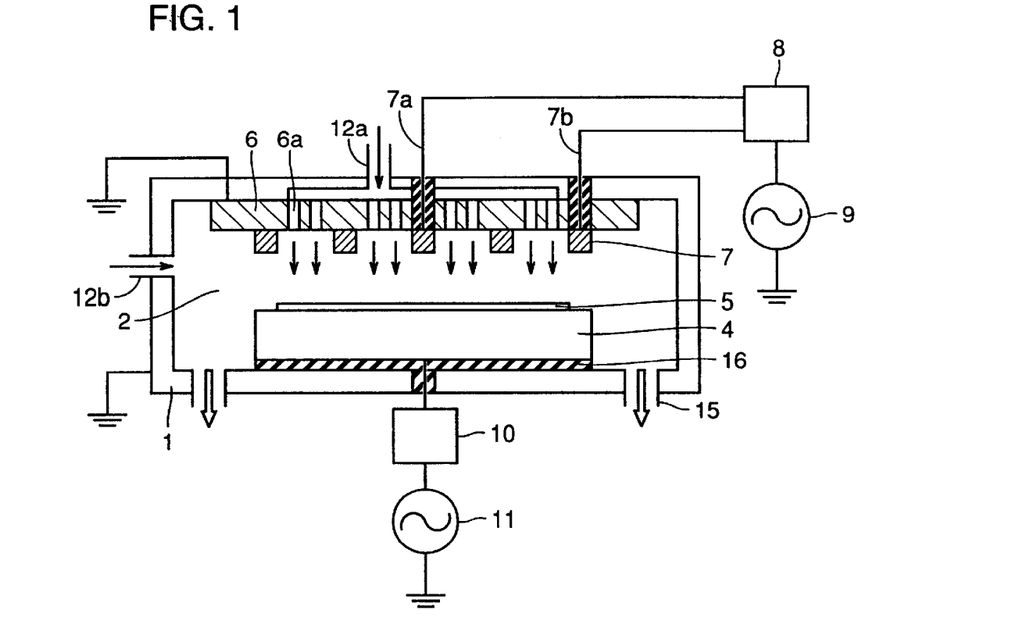
FIGS. 1, 2 and 3 are conceptual views of plasma processing apparatuses according to first, second and third embodiments of the present invention.

FIG. 1 is a conceptual view of a plasma processing apparatus according to the present embodiment. The apparatus is a plasma etching apparatus having a processing chamber 1 made of conductive material, such as aluminum. A predetermined etching process is provided in a processing reactor 2 formed in chamber 1.

Depending on the type of the processing gases used, chamber 1 may have its internal wall sputtered by a plasma generated in processing reactor 2 or may be etched due to a chemical reaction. To avoid such disadvantages, chamber 1 may have its internal wall coated with alumina-covered aluminum or protected by a quartz. Furthermore, processing chamber 2 may have its internal wall heated to prevent reaction products and the like from depositing on the internal wall of chamber 1.

Chamber 1 is grounded, and at its bottom a mounting stage 4 for mounting thereon a sample such as a semiconductor wafer (simply referred to as a "wafer" hereinafter) is set, with an insulation plate 16 of ceramic or the like interposed therebetween. Furthermore, an opposite electrode 6 in the form of a plate of a conductive material such as silicon is hermetically set at a top plate of chamber 1 opposite to a sample 5 mounting surface of mounting stage 4. Opposite electrode 6 is also grounded.

An RF antenna 7 made of a conductor, such as carbon, that is spiral, coil or loop form, is arranged at that side of opposite electrode 6 which faces mounting stage 4 in processing reactor 2. An RF antenna 7 is connected via a terminal 7a, 7b and a matching device 8 to RF power supply 9.

Furthermore, mounting stage 4 has a wafer holding device (not shown) and a wafer cooling device (not shown) and is also connected to an RF supply 11 via a matching device 10. A processing gas from a gas supply source (not shown), such as a gas cylinder, is supplied into processing reactor 2 through a gas line 12a and a gas shower head 6a provided in opposite electrode 6. The processing gas can also be supplied into processing reactor 2 via a gas tubing 12b provided in a side of chamber 1. The flow rate of the processing gas is controlled by a mass flow controller (not shown).

In order to prevent metal contamination, opposite electrode 6 is preferably made, e.g., of silicon and RF antenna 7 is preferably made, e.g., of carbon.

The processing gas introduced into processing reactor 2 is exhausted externally from exhaust pipes 15 by a turbomolecular pump (not shown).

Function and Effect

An RF antenna 7 receiving an RF power can radiate an electro-magnetic wave in processing chamber 2. By the collision between the electrons present in the electromagnetic field and the molecules of a processing gas, the processing gas can be ionized and a plasma can be generated. The ions in the generated plasma can be accelerated by an RF power, e.g., of 400 kHz applied independently to sample 5 mounting stage 4, and thus introduced to the surface of sample 5 to etch the sample.

Carbon has a volume resistivity of $0.2 \times 10^{-3}$ to $4 \times 10^{-3}$ $\Omega \cdot cm$ (for carbon graphite) and silicon has a volume resistivity of 2 to 300 $\Omega \cdot cm$ (for intrinsic semiconductor), providing a significant difference therebetween. Thus, if opposite electrode 6 is in contact with RF antenna 7, an RF current flows in RF antenna 7 rather than to opposite electrode 6. Any combination of materials other than provided above may be used that can prevent metal contamination and also have a large volume resistivity difference therebetween.

More specifically, it is preferable that a material for RF antenna 7 have no more than 1/100 the volume resistivity of that for opposite electrode 6, so that current leakage is not a serious disadvantage.

Opposite electrode 6 and RF antenna 7 that may be in contact with each other allow more space to be saved.

Furthermore, varying an RF power applied to RF antenna 7 can vary a value of a current through RF antenna 7 to adjust plasma density.

The plasma processing apparatus of the present embodiment is distinguished from a conventional inductively coupled plasma processing apparatus, provided with RF antenna in processing reactor 2, so that there is not dielectric, such as quartz, present between RF antenna 7 and a plasma. Thus the apparatus can be free of the loss caused by such a dielectric. Thus, a transmission efficiency of an RF power to a plasma can be enhanced to obtain a low-pressure high-density plasma with a lower power in comparison with the conventional apparatus and thus increase the processing rate of the apparatus.

The generation of a low-pressure high-density plasma by radio frequency of a lower power can also reduce sputtering of RF antenna 7. Furthermore, the load of the entire RF circuit, from RF power supply 9 to RF antenna 7, can also be reduced to decrease failures, abnormal operations and the like of the RF circuit to extend the apparatus maintenance cycle. Furthermore, the lower power required for the RF power can also result in reduced power consumption.

In a conventional inductively coupled plasma processing apparatus, the phenomenon that plasma density rapidly increases by increasing RF power more than a value (a mode jump phenomenon) is observed, and depending on an RF power a processing condition can be restricted due to mode jump phenomenon. In contrast, with the configuration described above, plasma density can gradually increase as RF power increases. Therefore, the processing condition is not restricted by the RF power applying condition.

In a conventional inductively coupled plasma apparatus, while dielectric material such as quartz is positioned facing mounting stage 4, any parts grounded in and around mounting stage 4, such as a bolt used to fix mounting stage 4, are positioned so as not to face to the sample, so that RF bias voltage applied to sample 5 is non-uniform by any grounded parts described above. As a result, sample 5 may not be processed uniformly. Furthermore an irregular arc discharge can also be occurred between sample 5 and any grounded parts described above or a gate valve partitioning the processing reactor and a transport chamber.

In contrast, the configuration with grounded electrode 6 positioned opposite to mounting stage 4 allows RF bias voltage to be uniformly applied to sample 5 to uniformly process sample 5.

Thus, when the plasma etching processing apparatus of the present embodiment is used in manufacturing a semiconductor device, the semiconductor device can be plasma-etched uniformly over the entire surface thereof. Any plasma processes other than etching can also be similarly applied.

Other Apparatus Configurations

In the present embodiment, RF antenna 7 is made of carbon. When the present embodiment with RF antenna 7 made of carbon is used, e.g., to etch an oxide film, ions collide with the antenna's surface, from which carbon can be advantageously supplied into a plasma to supply carbon to a sample without adding a carbon-containing gas to processing gases or adjusting the flow rate of the carbon-containing gas to supply carbon into a processing reactor.

Furthermore, RF antenna 7 may be made of aluminum, copper, tungsten and titanium or the like if metal CVD is applied to deposit a thin metal film on a pattern. For example, RF antenna 7 made of copper does not affect metal CVD using copper, nor does RF antenna 7 any of the other materials affect metal CVD using the material.

RF antenna 7 formed, e.g., of aluminum, copper, tungsten, or titanium may also be used in etching, although it is necessary to select an antenna material which cannot or hardly react with processing gases and plasma. For example, in general, aluminum is etched using chlorine containing gas, so that RF antenna 7 may be made of tungsten, which is hardly etched by chloride.

RF antenna 7 may also be formed of stainless steel. Stainless steel can be used in any processes if there is no possibility of metal contamination.

While the opposite electrode of the present embodiment is made of silicon, it may be made, e.g., of silicon carbide (SiC). Silicon carbide has a volume resistivity of approximately 1000 Ω·cm, although depending on the mixing ratio between Si and C, and it is very hard and has a melting point of approximately 2000° C., so that it does not react with other elements if it is heated significantly. Thus, opposite electrode 6 of silicon carbide is hardly sputtered, so that dust particle generation from opposite electrode 6 can be prevented.

While in the present embodiment a plasma etching apparatus has mainly been described, a plasma CVD processing apparatus can also be similarly described. In particular, in deposition of thin insulation film on high aspect ratio patterns, the configuration described above allows an RF bias voltage to be uniformly applied to a sample so that the insulation film can be buried into the high aspect ratio patterns, resulting a further uniform process.

Second Embodiment

Apparatus Configuration

Figure 2:
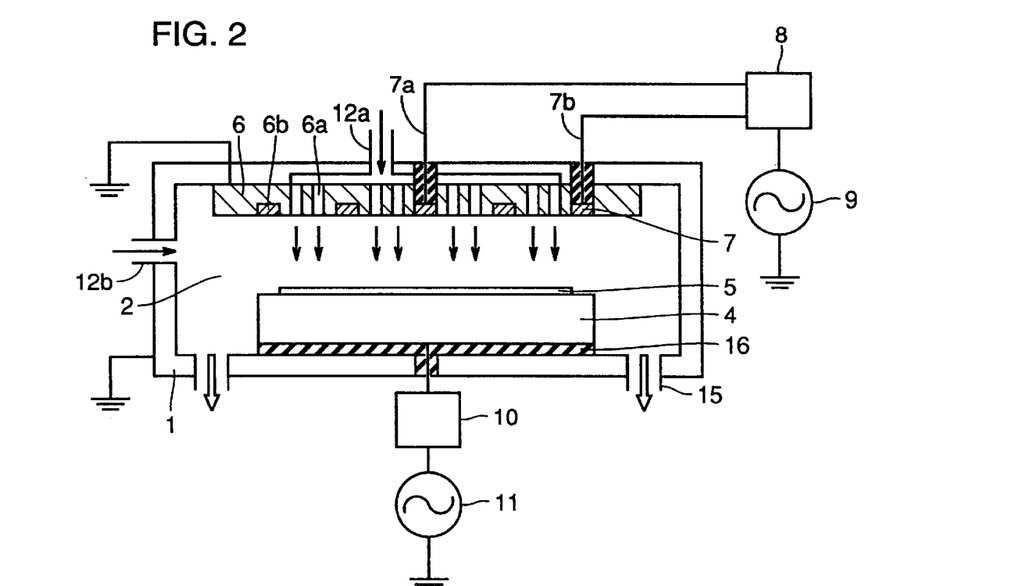

FIG. 2 is a conceptual view of a plasma processing apparatus of the present embodiment. The present embodiment has the same configuration as the first embodiment, except that RF antenna 7 is attached, buried in a groove 6b provided in opposite electrode 6 and also has its surface partially exposed to a plasma.

Function and Effect

Figure 4A:
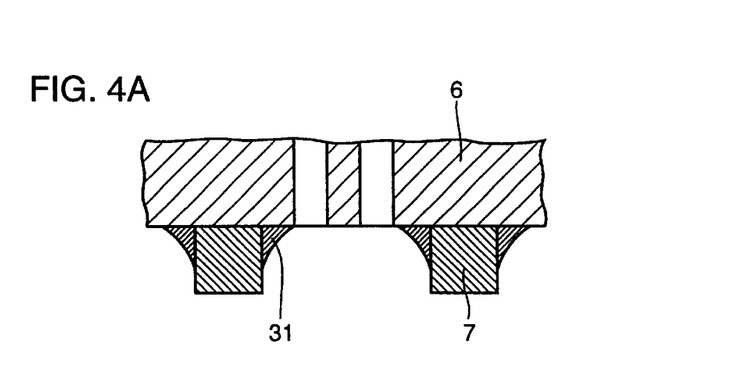
FIG. 4A illustrates deposition of reaction products or the like to corners in the second embodiment.
Figure 4B:
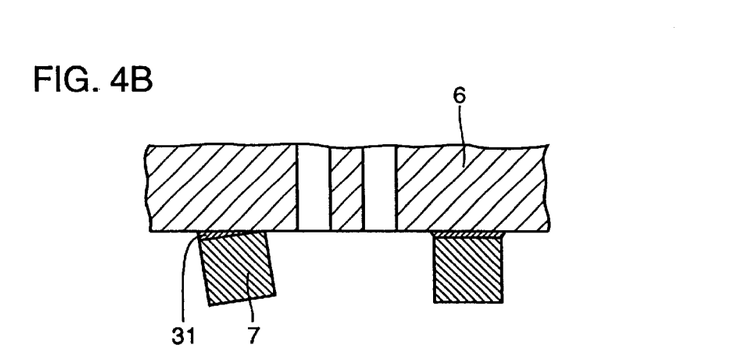
FIG. 4B illustrates deposition of reaction products or the like to gaps in the second embodiment.

In the present embodiment, the configuration as shown in FIG. 2 can reduce dust particle, preventing reaction products 31 and the like from depositing, e.g., on a corner formed by opposite electrode 6 and RF antenna 7 (as shown in FIG. 4A) or in a gap space between opposite electrode 6 and RF antenna 7 that is attributed to poor working precision, thermal distortion and the like (as shown in FIG. 4B).

Furthermore, by applying a direct current or a low-frequency current to an RF current flowing through RF antenna 7, a DC bias or a self-bias voltage can be applied to RF antenna 7 for sputtering of RF antenna 7 by accellated ions. Thus, the deposition of reaction products and the like on RF antenna 7 can be reduced and hence the count of dust particles can decrease.

Third Embodiment

Apparatus Configuration

Figure 3:
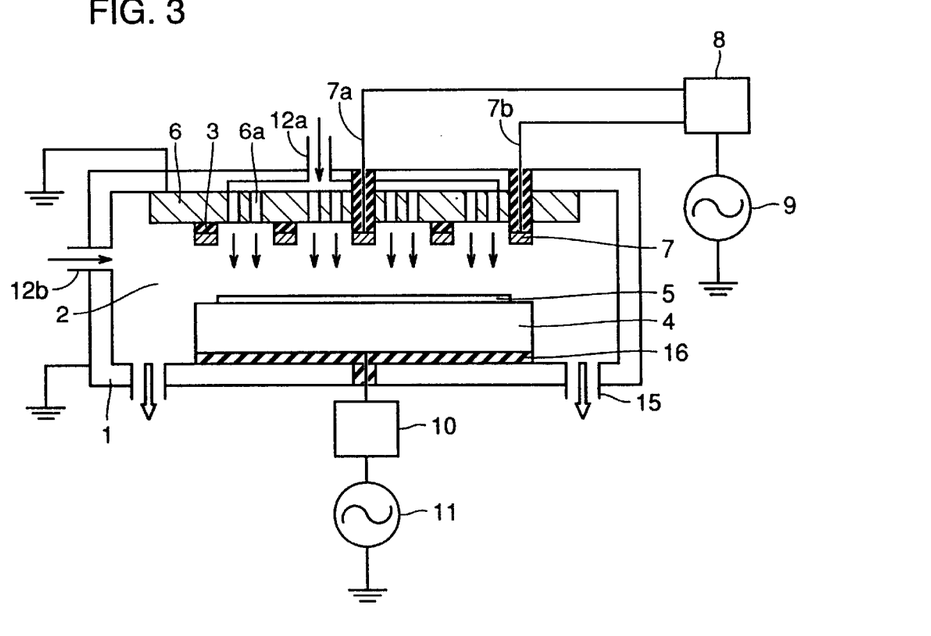

FIG. 3 is a schematic view of a plasma processing apparatus of the present embodiment. The present embodiment has the same configuration as the first embodiment, except that a dielectric film 3 is provided between opposite electrode 6 and RF antenna 7 to prevent direct contact between opposite electrode 6 and RF antenna 7.

Function and Effect

In the present embodiment, dielectric film 3 provided between opposite electrode 6 and RF antenna 7 to prevent electric contact therebetween, can eliminate the possibility of an RF current flowing to opposite electrode 6. Accordingly, opposite electrode 6 and RF antenna 7 may be made of materials which are equal or slightly different in volume resistivity.

Figure 5A:
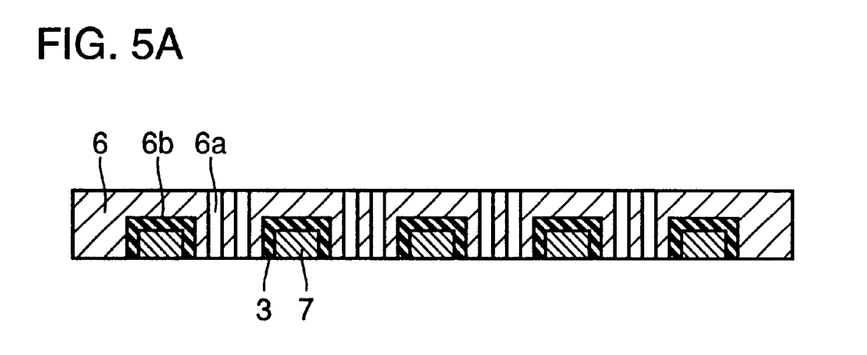
FIGS. 5A–5C show configurations of opposite electrodes and RF antennas in the third embodiment.
Figure 5B:
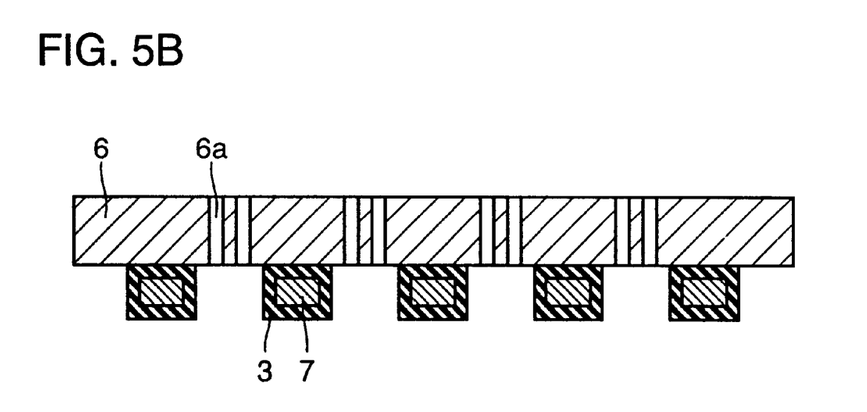
Figure 5C:
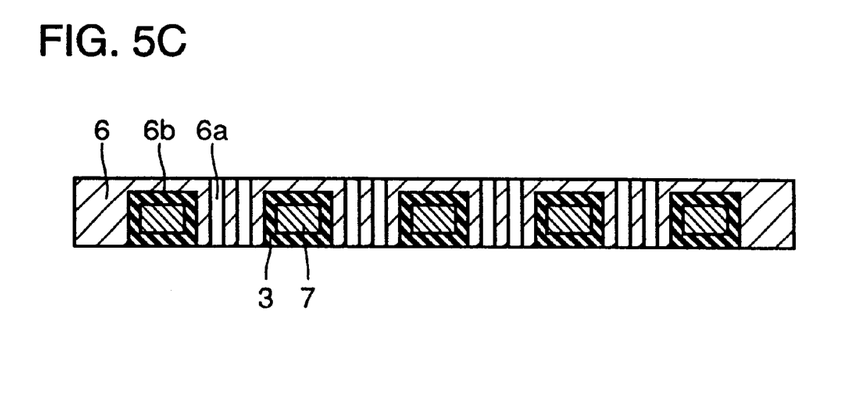
Figure 6A:
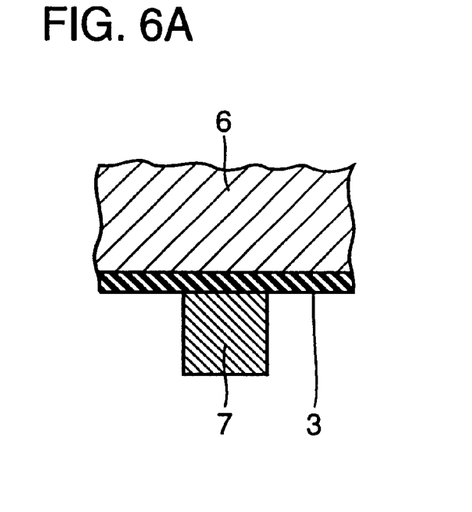
FIGS. 6A–6D show configurations of an opposite electrode and an RF antenna in the third embodiment.
Figure 6B:
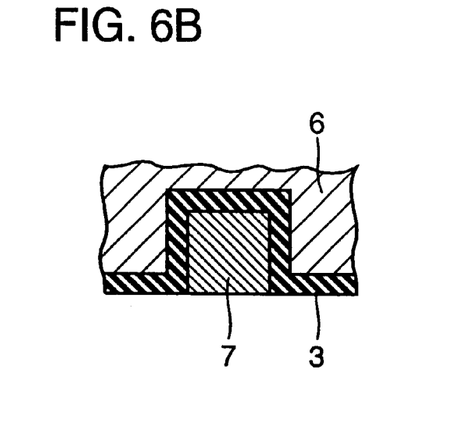
Figure 6C:
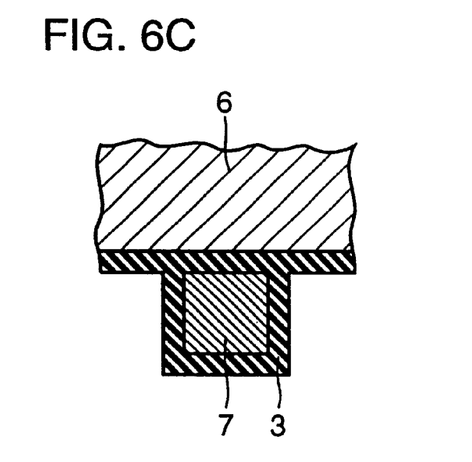
Figure 6D:
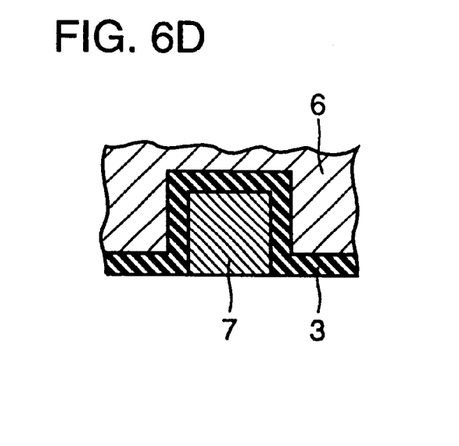

It should be noted that to prevent electric contact between opposite electrode 6 and RF antenna 7, RF antenna 7 may be partially or entirely covered with dielectric film 3, as shown in FIGS. 5A–5C, or opposite electrode 6 may have its surface covered with dielectric film 3, as shown in FIGS. 6A–6D.

Fourth Embodiment

Apparatus Configuration

Figure 7:
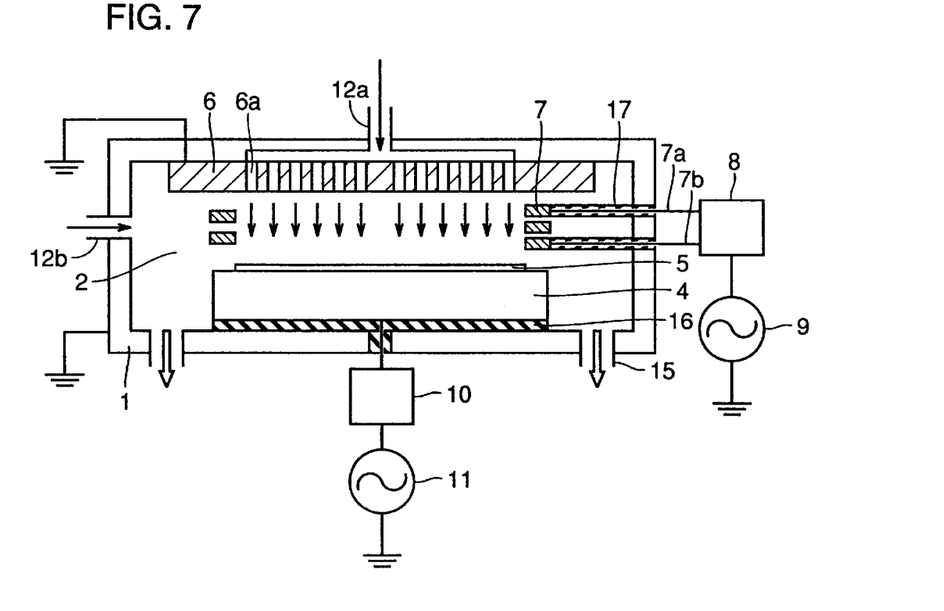
FIGS. 7 and 8 are conceptual views of plasma processing apparatuses according to fourth and fifth embodiments of the present invention.

FIG. 7 is a conceptual view of a plasma processing apparatus of the present embodiment. The present embodiment has the same configuration as the first embodiment, except that opposite electrode 6 and RF antenna 7 are spaced and that a wiling which introduces an RF current to RF antenna 7 supported in processing reactor 2 and spaced apart from opposite electrode 6 is covered with an insulation cover 17 and thus electrically isolated from other parts.

Function and Effect

The present embodiment can be effective on a process where a conductive film deposits on RF antenna 7, since opposite electrode 6 and RF antenna 7 that are spaced out will not be short-circuit if a conductive foreign matter or film deposits or adsorbs on RF antenna 7. Furthermore, the process in the apparatus can be further less affected by the deposition of conductive film if RF antenna 7 is formed of a same material as the deposited film.

Fifth Embodiment

Apparatus Configuration

Figure 8:
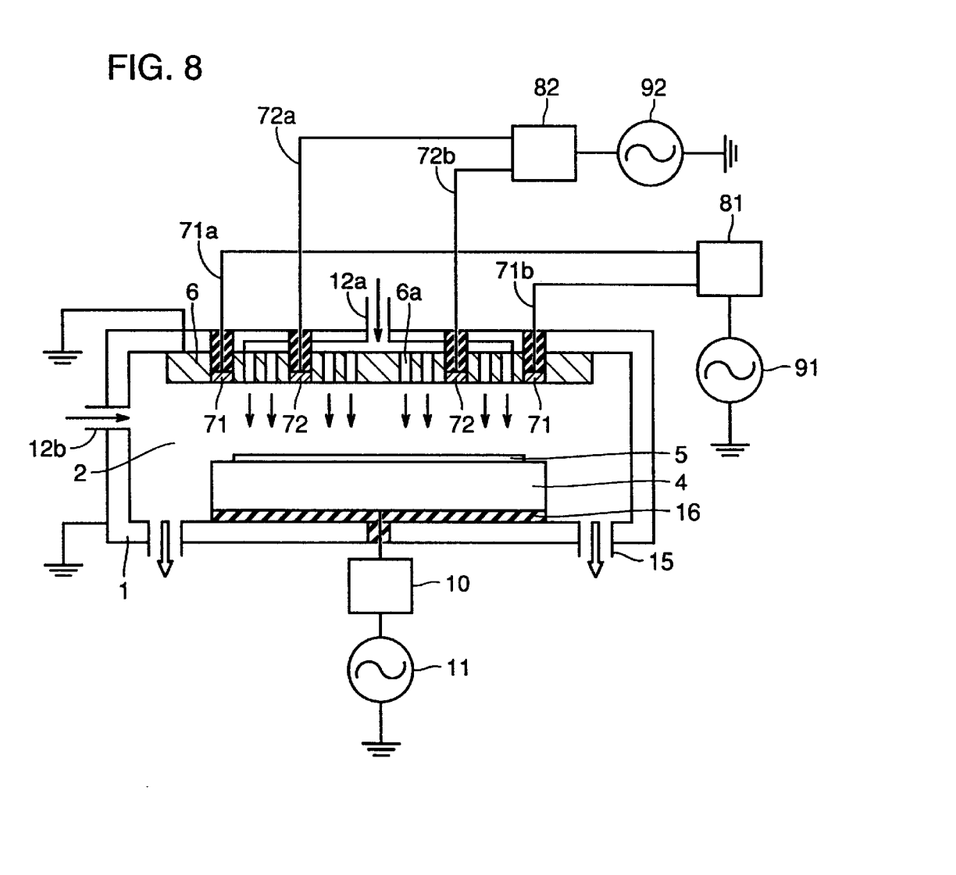

FIG. 8 is a conceptual view of a plasma processing apparatus of the present embodiment. The present embodiment has the same configuration as the first embodiment, except that two RF antennas 71 and 72 different in diameter are buried in opposite electrode 6 such that the centers of RF antennas 71 and 72 are arranged on the center axis of the chamber and the surfaces of RF antennas 71 and 72 are exposed to the plasma.

Function and Effect

In the present embodiment, connecting terminals 71a, 71b to an RF power supply 91 and terminals 72a, 72b to an RF power supply 92 can vary a distribution of a density of a plasma generated in processing reactor 2. As compared to a conventional, inductively coupled plasma processing apparatus, the present embodiment, with RF antennas 71, 72 in processing reactor 2, can reduce the mutual inductance between RF antennas 71 and 72. Thus each RF antenna may advantageously receive an RF power applied in various manners and having a wider range of frequencies applied.

Furthermore, a switch circuit may be provided out of chamber 1 to change the manner of applying an RF power to two RF antennas 71, 72. More specifically, referring to FIG. 9, there are provided two looped antennas 71, 72 having different diameters. A switch circuit (not shown) can be used to connect terminals 71b and 72a together via a connection 73 and connect an RF power supply between terminals 71a and 72b to use two RF antennas 71 and 72 as a single RF antenna. Connection 73 may also be opened and, as shown in FIG. 8, RF antennas 71, 72 may each be connected to a different RF power supply.

Figure 9:
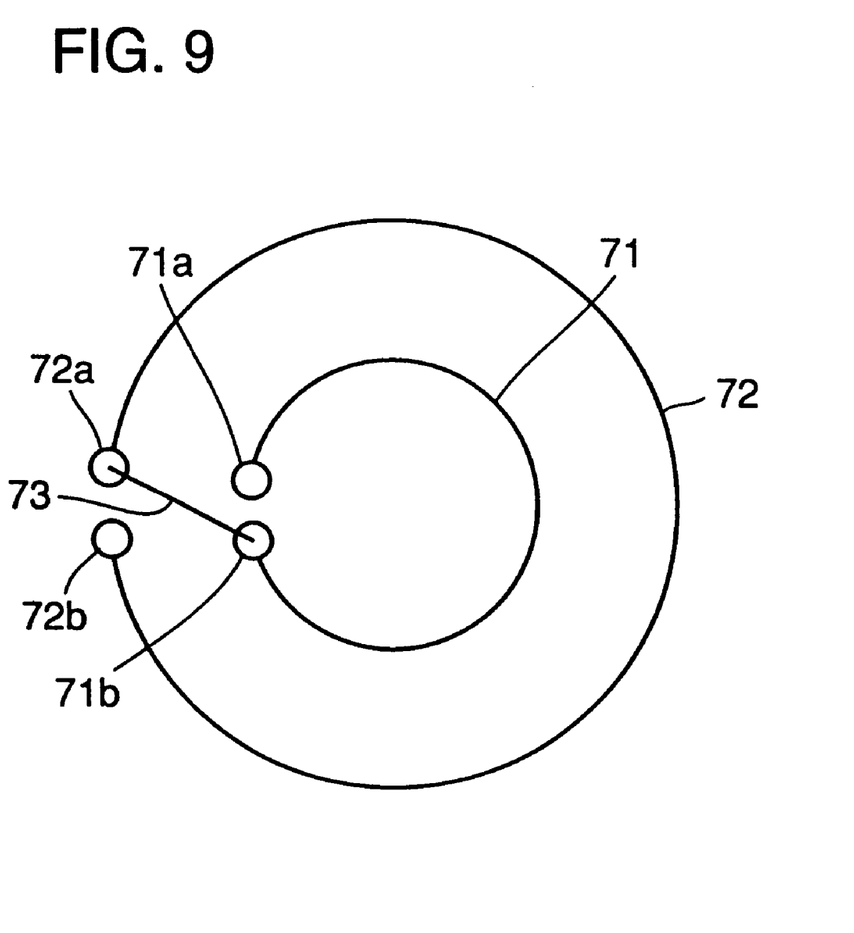
FIG. 9 schematically illustrates RF antennas arranged in the plasma processing apparatus according to the fifth embodiment.

It should be noted that a typical, inductively coupled plasma apparatuses can also have RF antennas 71, 72 as arranged in the present embodiment. Furthermore, RF antennas may have their terminals mutually connected to use the antennas as a single antenna. Furthermore, two RF antennas having a same diameter may be arranged on the center axis of the chamber, one overlying the other, as required.

Sixth Embodiment

Apparatus Configuration

Figure 10:
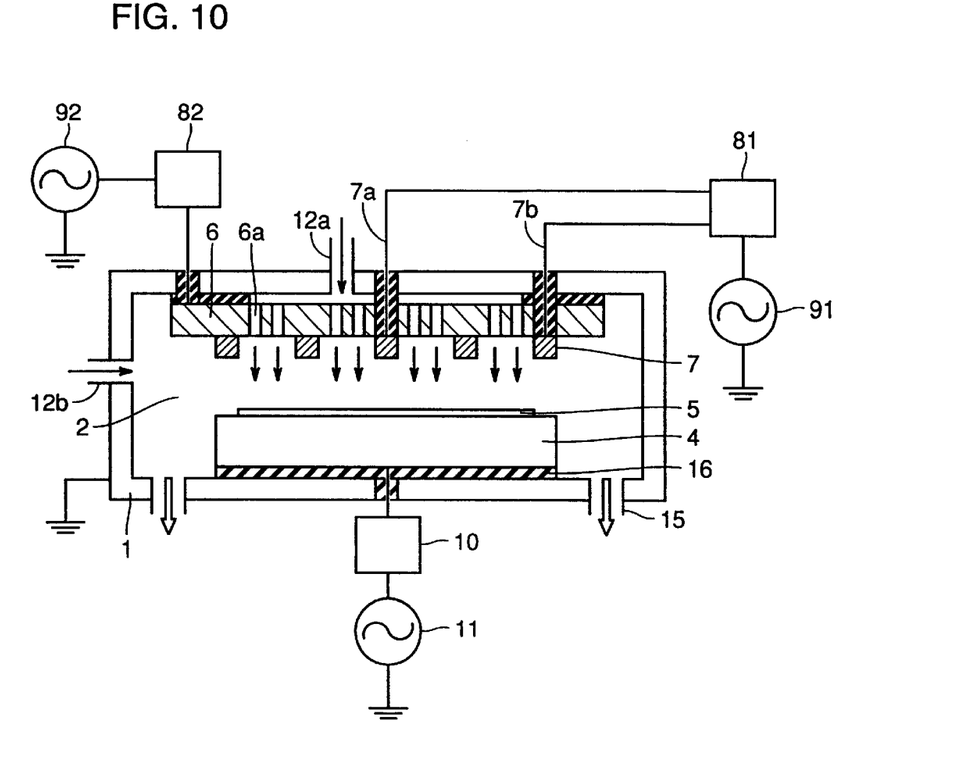
FIG. 10 is a conceptual view of a plasma processing apparatus according to a sixth embodiment of the present invention.

FIG. 10 is a conceptual view of a plasma processing apparatus of the present embodiment. The present embodiment has the same configuration as the first embodiment, except that opposite electrode 6 is connected via a matching device 82 to RF power supply 92 which is lower in frequency than RF power supply 91.

Function and Effect

In generation of a plasma, RF power supply 92 can apply an RF power to opposite electrode 6 to produce a self-bias voltage at opposite electrode 6 to allow ions to sputter opposite electrode 6.

For example, if opposite electrode 6 is made of silicon and a fluorocarbon-type gas is used as a processing gas, fluorine ions and atoms in a plasma can react with the silicon of opposite electrode 6 to produce silicon fluoride. Thus the fluorine in the plasma can be consumed by opposite electrode 6 to change the composition ratio between ions and neutral particles in the plasma.

With opposite electrode made of carbon, for example, ions incident on opposite electrode 6 can sputter opposite electrode 6 to emit the carbon of opposite electrode 6 into a plasma and thus increase the amount of carbon contained in the plasma.

Thus the application of a bias voltage to opposite electrode 6 allows a composition ratio between ions and neutral particles in a plasma to be controlled to provide an optimal process. Connecting a direct current power supply in place of RF power supply 92 may be similarly effective.

In accordance with the present invention, a plasma processing apparatus may have an opposite electrode positioned opposite to a mounting stage thereof and an RF antenna provided in a processing chamber thereof to enhance a processing rate thereof and also provide uniform process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus for processing a sample comprising:
   a processing chamber;
   one or more radio frequency antennas disposed within said processing chamber; and
   a grounded opposite electrode located opposite to the sample provided in said processing chamber;
   said radio frequency antennas being buried in said opposite electrode such that a portion of said radio frequency antenna is partially exposed to the plasma; and
   said radio frequency antenna receiving a radio frequency power to generate an inductively coupled plasma in said processing chamber to process the sample.

2. The plasma processing apparatus according to claim 1, including means applying a self-bias voltage by a radio frequency power or a direct current voltage to said opposite electrode.

3. The plasma processing apparatus according to claim 2, having means applying a radio frequency power to said radio frequency antenna and a radio frequency power to said opposite electrode, with a frequency difference between the radio frequency powers applied to said radio frequency antenna and said opposite electrode.

4. The plasma processing apparatus according to claim 1, wherein said radio frequency antenna and said opposite electrode are spaced.

5. The plasma processing apparatus according to claim 1, wherein said radio frequency antenna is made of a material having no more than $1/100$ a volume resistivity of a material forming said opposite electrode.

6. The plasma processing apparatus according to claim 5, wherein said radio frequency antenna and said opposite electrode are in contact with each other.

7. The plasma processing apparatus according to claim 1, wherein that portion of said radio frequency antenna is covered with a dielectric film that is in contact with said opposite electrode.

8. The plasma processing apparatus according to claim 1, wherein said opposite electrode is covered with a dielectric film.

9. The plasma processing apparatus according to claim 1, wherein said radio frequency antenna is made of at least one type of material selected from the group consisting of carbon, aluminum, copper, stainless steel, tungsten and titanium.

10. The plasma processing apparatus according to claim 1, wherein said opposite electrode is formed of at least one type of material selected from the group consisting of silicon, carbon and silicon carbide.

11. The plasma processing apparatus according to claim 1, including:
    a circuit arranged to apply a radio frequency power to each said radio frequency antenna; and
    a switch circuit capable of changing a configuration of said radio frequency power applying circuit; wherein
    said switch circuit can change over to substantially change a configuration of each said radio frequency antenna.

* * * * *